(12) United States Patent
Kageyama (10) Patent No.: US 8,227,922 B2
(45) Date of Patent: Jul. 24, 2012

(54) SEMICONDUCTOR DEVICE HAVING A MULTILAYER INTERCONNECTION STRUCTURE THAT INCLUDES AN ETCHING STOPPER FILM

(75) Inventor: Satoshi Kageyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 348 days.

(21) Appl. No.: 12/289,985

(22) Filed: Nov. 7, 2008

(65) Prior Publication Data

US 2009/0115062 A1    May 7, 2009

(30) Foreign Application Priority Data

Nov. 7, 2007  (JP) .................................. 2007-289779

(51) Int. Cl.
*H01L 23/48* (2006.01)

(52) U.S. Cl. ........ 257/774; 257/758; 257/759; 257/762; 257/773; 257/E23.145; 257/E21.579; 257/E21.585

(58) Field of Classification Search .................. 257/758, 257/759, 762, 773, 774, E21.579, E21.585, 257/E23.145

See application file for complete search history.

(56) References Cited

U.S. PATENT DOCUMENTS

| 7,179,747 | B2 * | 2/2007 | Papa Rao et al. | 438/700 |
| 7,763,979 | B2 * | 7/2010 | Ohto et al. | 257/759 |
| 7,834,459 | B2 * | 11/2010 | Kageyama | 257/773 |

FOREIGN PATENT DOCUMENTS

| JP | 2002-343858 | 11/2002 |
| WO | WO 2005069367 A1 * | 7/2005 |
| WO | WO 2006046487 A1 * | 5/2006 |

* cited by examiner

*Primary Examiner* — Kenneth Parker
*Assistant Examiner* — Jose R Diaz
(74) *Attorney, Agent, or Firm* — Rabin & Berdo, P.C.

(57) ABSTRACT

A semiconductor device includes a lower layer wiring made of a conductive material; an etching stopper film laminated on the lower layer wiring and having a laminated structure including an SiCO layer and an SiCN layer; an interlayer insulating film laminated on the etching stopper film; an intermediate film laminated on the interlayer insulating film and made of a material having an etching selectivity with respect to a material of the etching stopper film; an upper wiring layer laminated on the intermediate film and having an upper groove formed in a top surface thereof; an upper layer wiring embedded in the upper groove and made of a metal material having Cu as a main component; and a via electrically connecting the lower layer wiring and the upper layer wiring and disposed in a via hole penetrating through the interlayer insulating film and the intermediate film.

15 Claims, 6 Drawing Sheets

SEMICONDUCTOR DEVICE HAVING A MULTILAYER INTERCONNECTION STRUCTURE THAT INCLUDES AN ETCHING STOPPER FILM

BACKGROUND OF THE INVENTION

1. Field of the Invention

The present invention relates to a semiconductor device having a multilayer interconnection structure.

2. Description of Related Art

A so-called multilayer interconnection structure, in which a plurality of wiring layers are laminated on a semiconductor substrate, is widely employed in semiconductor devices. In semiconductor devices having such a multilayer interconnection structure, in place of Al (aluminum) which has been conventionally used, use of Cu (copper) which has a higher conductivity, as a wiring material for reducing wiring resistance is being examined.

FIGS. 3A to 3D are schematic sectional views showing, in order of process, a method for manufacturing upper layer wirings in a multilayer interconnection structure using Cu as a wiring material.

Figure 3A:
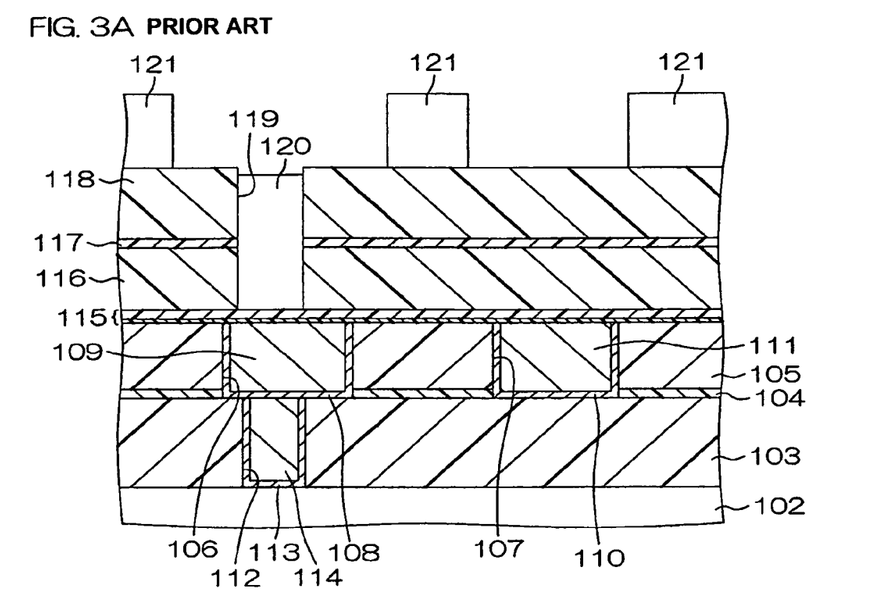
FIG. 3A is a schematic sectional view for describing a method for manufacturing upper layer wirings in a conventional multilayer interconnection structure.

In a semiconductor device having a multilayer interconnection structure, first, on a semiconductor substrate 102 made of Si (silicon), a first interlayer insulating film 103 made of SiOC (silicon oxide with carbon added), a middle etching stopper film 104 made of SiCO (silicon carbide with oxygen added), and a first wiring layer 105 made of SiOC are laminated in that order from the semiconductor substrate 102 side as shown in FIG. 3A.

In the first wiring layer 105 and the middle etching stopper film 104, a first lower groove 106 and a second lower groove 107 are formed spaced apart from each other. In the first lower groove 106, a first lower layer wiring 109 made of Cu is embedded via a barrier film 108 made of Ta (tantalum). In the second lower groove 107, a second lower layer wiring 111 made of Cu is embedded via a barrier film 110 made of Ta.

A contact hole 112 is formed in the first interlayer insulating film 103. The contact hole 112 is formed in the first interlayer insulating film 103 by digging in from a bottom surface of the first lower groove 106 and reaches the semiconductor substrate 102. A contact plug 114 made of Cu is embedded in the contact hole 112 via a barrier film 113 made of Ta. The first lower layer wiring 109 is thereby electrically connected to the semiconductor substrate 102 via the contact plug 114.

In an upper layer wiring forming step, first, as shown in FIG. 3A, an etching stopper film 115 having a laminated structure of an SiCO layer and an SiCN (silicon carbonitride) layer, a second interlayer insulating film 116 made of SiOC, a middle etching stopper film 117 made of SiCO and a second wiring layer 118 made of SiCO are laminated in that order from the semiconductor substrate 102 side on the first wiring layer 105, the first lower layer wiring 109 and the second lower layer wiring 111. Thereafter, by etching of the second wiring layer 118, the middle etching stopper film 117 and the second interlayer insulating film 116, a via hole 119 reaching the etching stopper film 115 from an upper surface of the second wiring layer 118 is formed. A bulk 120 is embedded inside the via hole 119. Thereafter, a resist film 121 having openings respectively at a portion including the via hole 119 in a plan view and a portion spaced apart from the aforementioned portion is formed on the second wiring layer 118.

Figure 3B:
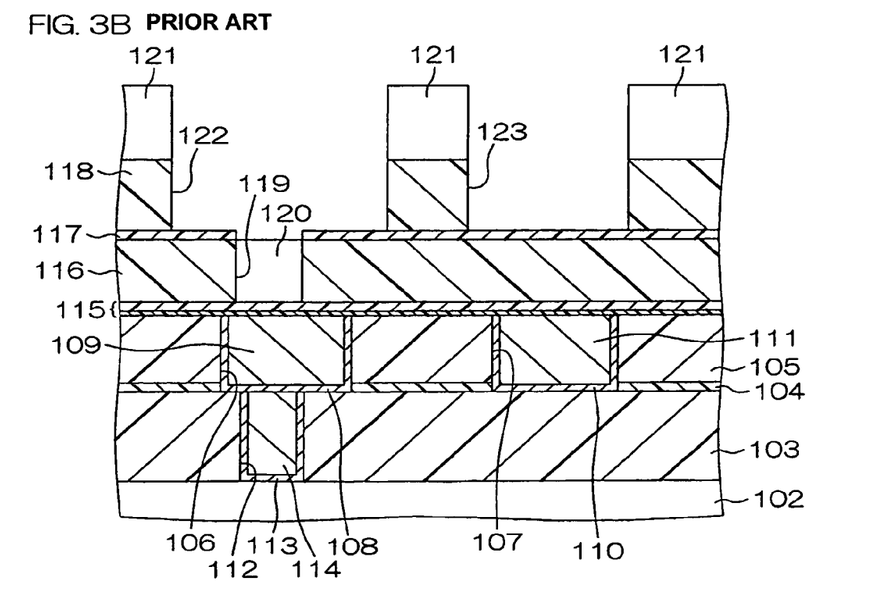
FIG. 3B is a schematic sectional view of a step subsequent to that of FIG. 3A.

Then, as shown in FIG. 3B, by etching using the resist film 121 as a mask, a first upper groove 122 and a second upper groove 123 are formed in the second wiring layer 118.

Figure 3C:
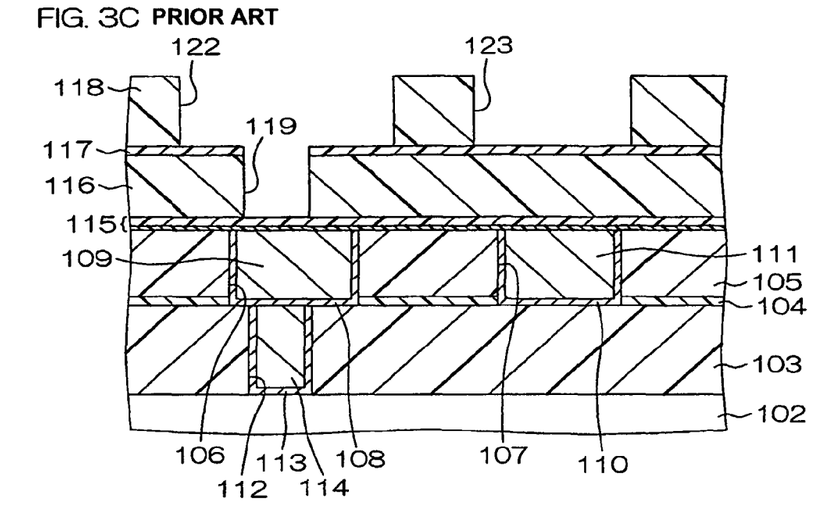
FIG. 3C is a schematic sectional view of a step subsequent to that of FIG. 3B.

Thereafter, as shown in FIG. 3C, the resist film 121 and the bulk 120 are removed by ashing.

Figure 3D:
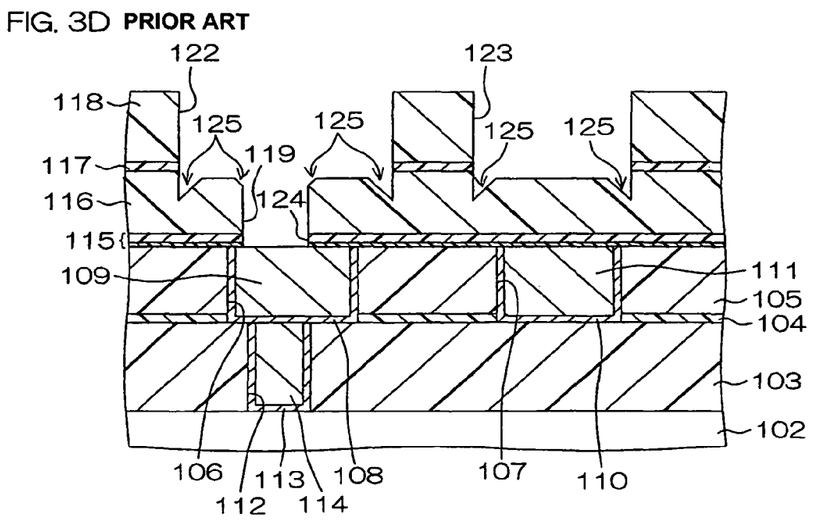
FIG. 3D is a schematic sectional view of a step subsequent to that of FIG. 3C.

Next, as shown in FIG. 3D, a portion of the etching stopper film 115 facing the via hole 119 is removed by etching. An opening 124 in communication with the via hole 119 and partially exposing an upper surface of the first lower layer wiring 109 is thereby penetratingly formed in the etching stopper film 115.

Thereafter, a barrier film (not shown) made of a material having a barrier property with respect to diffusion of Cu is coated onto inner surfaces of the first upper groove 122, the second upper groove 123 and the via hole 119 (including the opening 124). Then, by completely filling the inner side of the barrier film with Cu, a first upper layer wiring, a second upper layer wiring and a via (none of which are shown) are formed in the first upper groove 122, the second upper groove 123 and the via hole 119.

The middle etching stopper film 117 is made of the same material as the etching stopper film 115, in other words, of SiCO. Thus, in the process of forming the opening 124 in the etching stopper film 115, the middle etching stopper film 117 is etched along with the etching stopper film 115. When the middle etching stopper film 117 is removed by etching and the second interlayer insulating film 116 below it is exposed, the second interlayer insulating film 116 becomes etched. Consequently, because the second interlayer insulating film 116 becomes small in thickness, a parasitic capacitance arising across the second lower layer wiring 111 and the second upper layer wiring becomes large.

Further, etching of the second interlayer insulating film 116 may progress extremely at peripheral edge portions of bottom surfaces of the first upper groove 122 and the second upper groove 123, and undesired recesses 125 may form at these portions. In this case, by the first upper layer wiring and the second upper layer wiring entering into the recesses 125, an interval between the portion of the second upper layer wiring entering into the recess 125 and the second lower wiring 111 may become especially small, and this causes lowering of withstand voltage and increase of leak current therebetween. Further, by the first upper layer wiring and the second upper layer wiring entering into the recesses 125, cross sectional areas of the first upper layer wiring and the second upper layer wiring become non-uniform. Consequently, wiring resistances of the first upper layer wiring and the second upper layer wiring become non-uniform.

SUMMARY OF THE INVENTION

An object of the present invention is to provide a semiconductor device with which undesired etching of an interlayer insulating film below an upper layer wiring can be prevented.

A semiconductor device according to one aspect of the present invention includes: a lower layer wiring made of a conductive material; an etching stopper film laminated on the lower layer wiring; an interlayer insulating film laminated on the etching stopper film; an intermediate film laminated on the interlayer insulating film and made of a material having an etching selectivity with respect to a material of the etching stopper film; an upper wiring layer laminated on the intermediate film; an upper layer wiring made of a metal material having Cu as a main component and embedded in an upper groove formed by digging in from a top surface of the upper wiring layer; and a via for electrically connecting the lower layer wiring and the upper layer wiring, made of the same material as the material of the upper layer wiring and disposed in a via hole penetrating through the interlayer insulating film and the intermediate film.

With this configuration, the etching stopper film is laminated on the lower layer wiring made of the conductive material. The interlayer insulating film is laminated on the etching stopper film. The intermediate film made of the material having an etching selectivity with respect to the material of the etching stopper film is laminated on the interlayer insulating film. The upper wiring layer is laminated on the intermediate film. The upper groove is formed in the upper wiring layer. The upper layer wiring made of the metal material having Cu as the main component is embedded in the upper groove. The via hole is formed penetratingly in the interlayer insulating film and the intermediate film. The via made of the same material as the upper layer wiring is disposed in the via hole. The lower layer wiring and the upper layer wiring are electrically connected via the via.

For example, the upper layer wiring is formed by the following method. First, the interlayer insulating film, the intermediate film and the upper wiring layer are laminated in that order on the etching stopper film. The via hole penetrating through the upper wiring layer, the intermediate film and the interlayer insulating film is formed by photolithography and etching. Then, the upper groove for embedding the upper layer wiring is formed in a portion of the upper wiring layer including the via hole in a plan view. Thereafter, a portion of the etching stopper film facing the via hole is removed by etching and an opening partially exposing the lower layer wiring is formed in the etching stopper film.

The intermediate film is made of the material having an etching selectivity with respect to the material of the etching stopper film. Thus, there is no possibility for the intermediate film to be etched during the etching for forming the opening in the etching stopper film. Thus, the intermediate film can be left on the interlayer insulating film reliably. Consequently, undesired etching of the interlayer insulating film can be prevented.

The material of the etching stopper film may be SiCO, and the material of the intermediate film may be $SiO_2$ (silicon oxide). $SiO_2$ has a high etching selectivity with respect to SiCO. Thus, an intermediate film made of $SiO_2$ is not influenced by the etching for forming the opening in the etching stopper film. Consequently, undesired etching of the interlayer insulating film can be prevented satisfactorily.

Preferably, an upper barrier film having a barrier property with respect to Cu is interposed between the upper layer wiring and an inner surface of the upper groove. By the upper barrier film, the Cu contained in the upper layer wiring can be prevented from diffusing into the upper wiring layer, etc.

Further, a lower wiring layer may be disposed below the etching stopper film, and the lower layer wiring may be embedded in a lower groove formed by digging in from a top surface of the lower wiring layer.

The material of the lower layer wiring may be a metal material having Cu as a main component. Preferably, in this case, a lower barrier film having a barrier property with respect to Cu is interposed between the lower layer wiring and an inner surface of the lower groove. By the lower barrier film, the Cu contained in the lower layer wiring can be prevented from diffusing into the lower wiring layer, etc.

The foregoing and other objects, features, and effects of the present invention will become more apparent from the following detailed description of the embodiments with reference to the attached drawings.

DETAILED DESCRIPTION OF THE PREFERRED EMBODIMENTS

An embodiment of the present invention shall now be described in detail with reference to the attached drawings.

Figure 1:
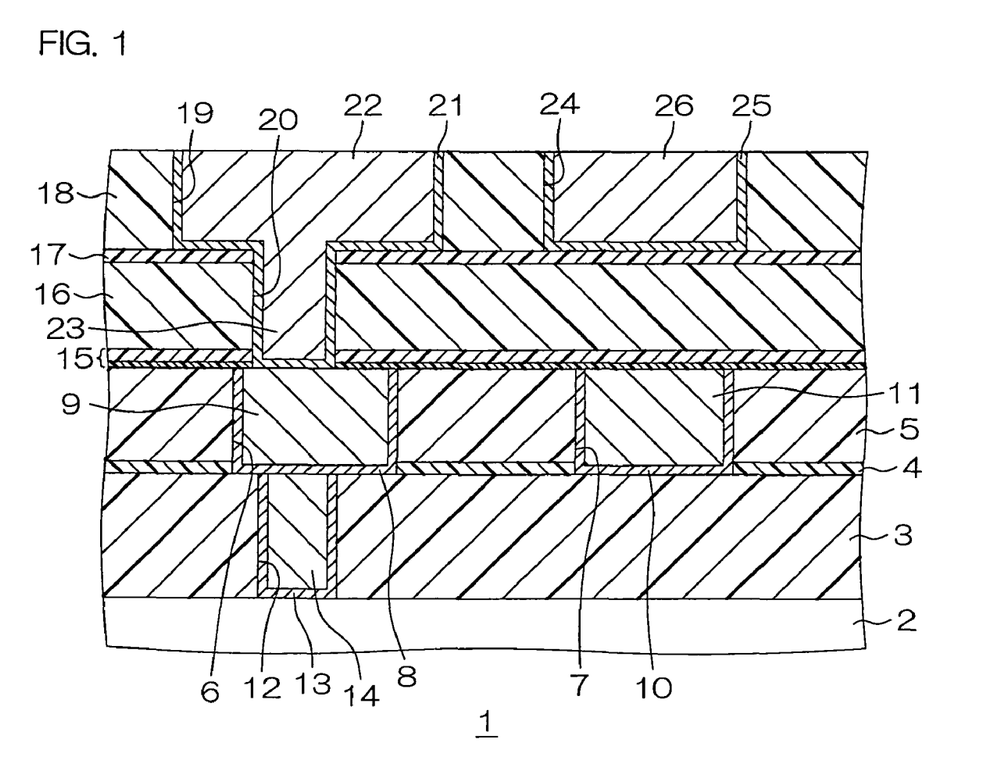
FIG. 1 is a schematic sectional view of a structure of a semiconductor device according to a first embodiment of the present invention.

FIG. 1 is a schematic sectional view of a structure of a semiconductor device according to a first embodiment of the present invention.

The semiconductor device 1 includes a semiconductor substrate 2. The semiconductor substrate 2 is constituted, for example, of a Si (silicon) substrate. A MOSFET (Metal Oxide Semiconductor Field Effect Transistor) or other element is formed in a top layer portion of the semiconductor substrate 2.

A first interlayer insulating film 3 made of SiOC, a middle etching stopper film 4 made of SiCO and a lower wiring layer 5 made of SiOC are laminated on the semiconductor substrate 2 in that order from the semiconductor substrate 2 side.

In the lower wiring layer 5 and the middle etching stopper film 4, a fine first lower groove 6 and second lower groove 7 are formed spaced apart from each other. In the first lower groove 6, a first lower layer wiring 9 made of Cu is embedded via a barrier film 8 made of Ta that has a barrier property with respect to Cu. In the second lower groove 7, a second lower layer wiring 11 made of Cu is embedded via a barrier film 10 made of Ta.

A contact hole 12 is penetratingly formed in the first interlayer insulating film 3. The contact hole 12 is formed in the first interlayer insulating film 3 by digging in from a bottom surface of the first lower groove 6, penetrates through the first interlayer insulating film 3, and reaches a top surface of the semiconductor substrate 2. A contact plug 14 made of Cu is embedded in the contact hole 12 via a barrier film 13 made of Ta. The first lower layer wiring 9 is thereby electrically connected to the semiconductor substrate 2 via the contact plug 14.

An etching stopper film 15 having a laminated structure of an SiCO layer and an SiCN layer is laminated on the lower wiring layer 5, the first lower layer wiring 9 and the second lower layer wiring 11. A second interlayer insulating film 16 made of SiOC is laminated on the etching stopper film 15. An intermediate film 17 made of $SiO_2$ that has selectivity with respect to SiCO, which is the material of the etching stopper film 15, is laminated on the second interlayer insulating film 16. An upper wiring layer 18 made of SiCO is laminated on the intermediate film 17.

A first upper groove 19 is formed in the upper wiring layer 18. The first upper groove 19 has a portion opposite to the first lower layer wiring 9 in a plan view. At the portion where the first upper groove 19 and the first lower groove 9 oppose each other in a plan view, a via hole 20 reaching the first lower layer wiring 9 from a bottom surface of the first upper groove 19 is formed penetratingly through the etching stopper film 15, the second interlayer insulating film 16 and the intermediate film 17.

Inner surfaces of the first upper groove 19 and the via hole 20 and a portion of a top surface of the first lower layer wiring 9 facing the via hole 20 are coated with a barrier film 21 made of Ta. By an inner side of the barrier film 21 being completely filled with Cu, a first upper layer wiring 22 embedded in the first upper groove 19 and a via 23 embedded in the via hole 20 are formed integrally. That is, an upper end of the via 23 is connected to the first upper layer wiring 22, and a lower end of the via 23 is connected to the first lower layer wiring 9 via the barrier film 21. The first upper layer wiring 22 is thereby electrically connected to the first lower layer wiring 9 via the via 23. An upper surface of the first upper layer wiring 22 is substantially flush with an upper surface of the upper wiring layer 18.

In the upper wiring layer 18, a second upper groove 24 is formed at a position spaced apart from the first upper groove 19. The second upper groove 24 is formed by digging the upper wiring layer 18 to the intermediate film 17 (and penetrates through the upper wiring layer 18). The second upper groove 24 has a portion opposite to the second lower layer wiring 11 in a plan view.

A barrier film 25 made of Ta is coated on an inner surface of the second upper groove 24. By an inner side of the barrier film 25 being completely filled with Cu, a second upper layer wiring 26 is embedded in the second upper groove 24. An upper surface of the second upper layer wiring 26 is substantially flush with the upper surface of the upper wiring layer 18.

FIGS. 2A to 2F are schematic sectional views illustrating, in order of process, a method for manufacturing the first upper layer wiring and the second upper layer wiring shown in FIG. 1.

Figure 2A:
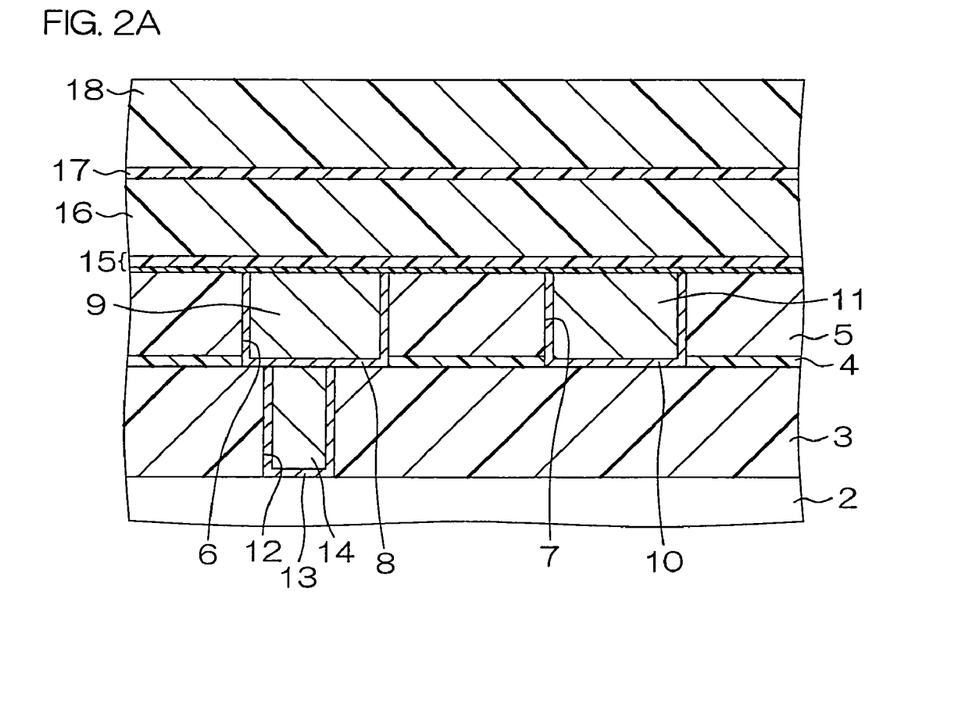
FIG. 2A is a schematic sectional view for describing a method for manufacturing upper layer wirings in the semiconductor device of FIG. 1.

First, as shown in FIG. 2A, the etching stopper film 15, the second interlayer insulating film 16, the intermediate film 17 and the upper wiring layer 18 are laminated in that order on the lower wiring layer 5, the first lower layer wiring 9 and the second lower layer wiring 11 by a CVD (Chemical Vapor Deposition) method.

Figure 2B:
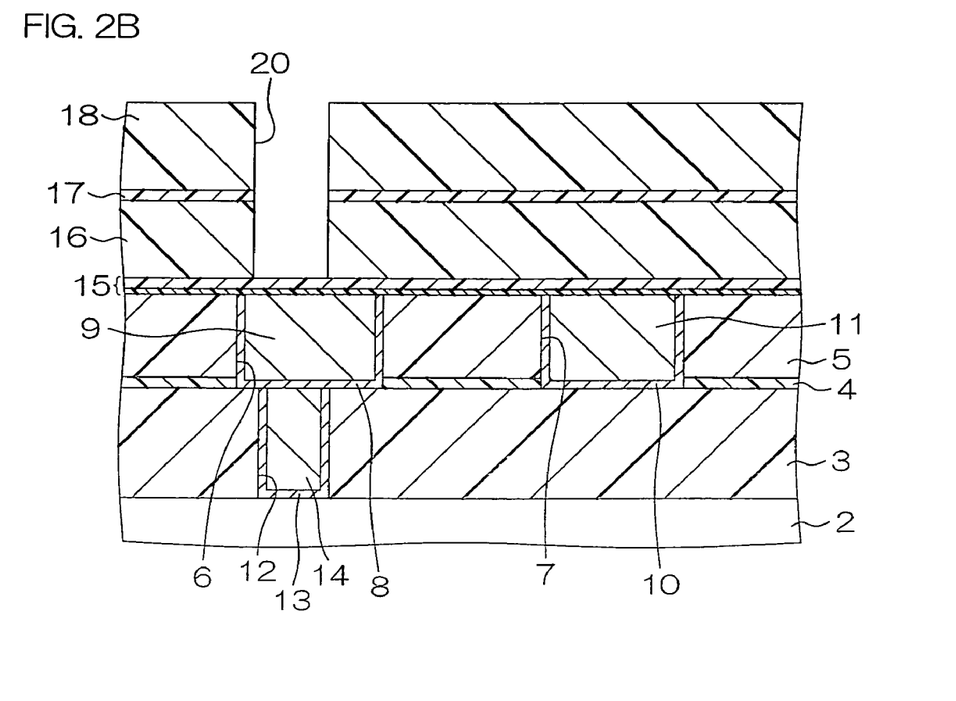
FIG. 2B is a schematic sectional view of a step subsequent to that of FIG. 2A.

Next, a resist film (not shown) having an opening selectively exposing a portion in which the via hole 20 is to be formed is formed on the upper wiring layer 18. By performing dry etching using the resist film as a mask, the via hole 20 penetrating through the upper wiring layer 18, the intermediate film 17 and the second interlayer insulating film 16 is formed as shown in FIG. 2B. In this process, the upper wiring layer 18, the intermediate film 17 and the second interlayer insulating film 16 are etched successively by switching a reaction gas (etchant) at appropriate timings. Due to the etching selectivity of SiCO and SiCN, which are the materials of the etching stopper film 15, with respect to SiOC, which is the material of the second interlayer insulating film 16, the etching of the second interlayer insulating film 16 stops at a point where the etching stopper film 15 becomes exposed.

Figure 2C:
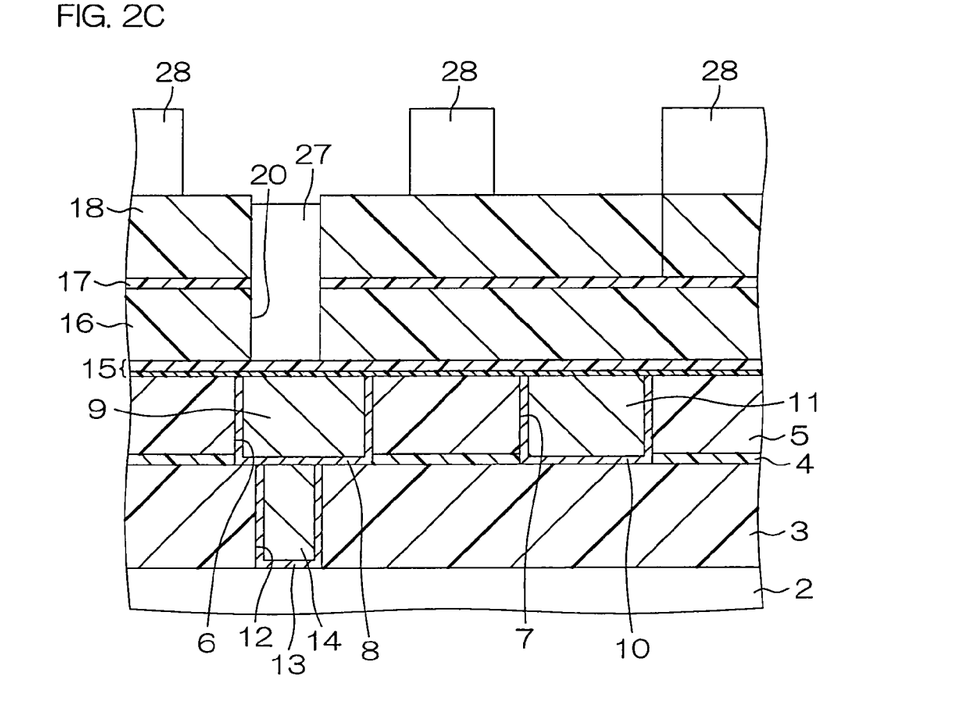
FIG. 2C is a schematic sectional view of a step subsequent to that of FIG. 2B.

As shown in FIG. 2C, the via hole 20 is completely filled with a bulk 27. Thereafter, a resist film 28 having openings selectively exposing portions where the first upper groove 19 and the second upper groove 24 are to be formed is formed on the upper wiring layer 18.

Figure 2D:
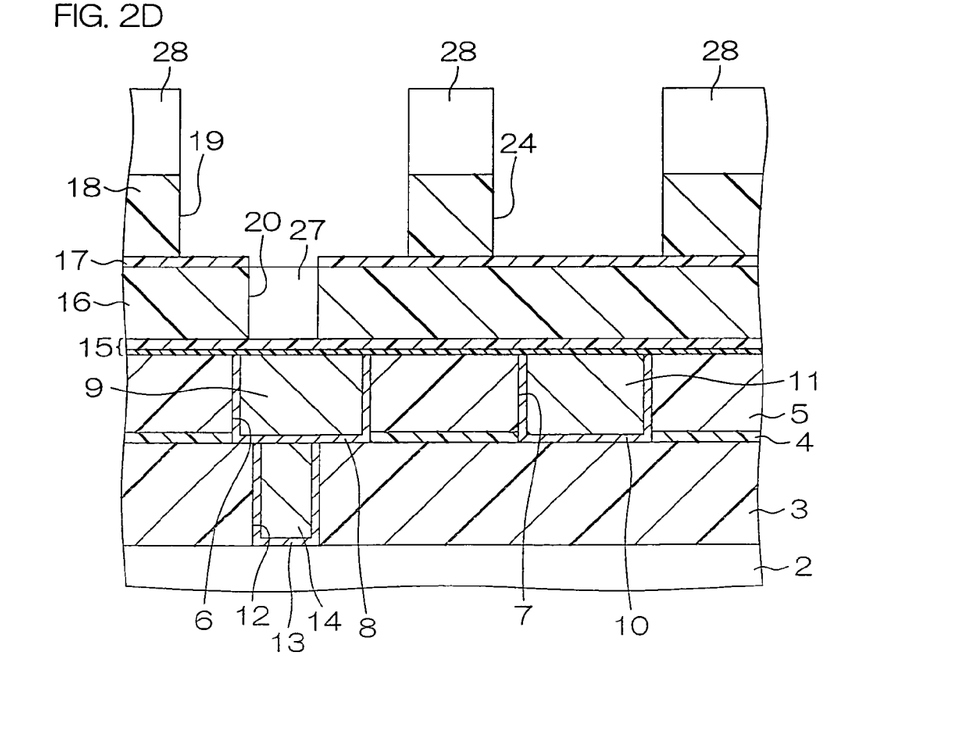
FIG. 2D is a schematic sectional view of a step subsequent to that of FIG. 2C.

The upper wiring layer 18 is etched using the resist film 28 as a mask. Due to the etching selectivity of $SiO_2$, which is the material of the intermediate film 17, with respect to SiCO, which is the material of the upper wiring layer 18, the etching stops at a point where the intermediate film 17 becomes exposed. The first upper groove 19 and the second upper groove 24 are thereby formed in the upper wiring layer 18 as shown in FIG. 2D. The etching of the upper wiring layer 18 may be stopped when the intermediate film 17 becomes exposed after elapse of a predetermined time from a start of etching or at a state where the upper wiring layer 18 remains thinly (more thinly than the etching stopper film 15) on the intermediate film 17.

Figure 2E:
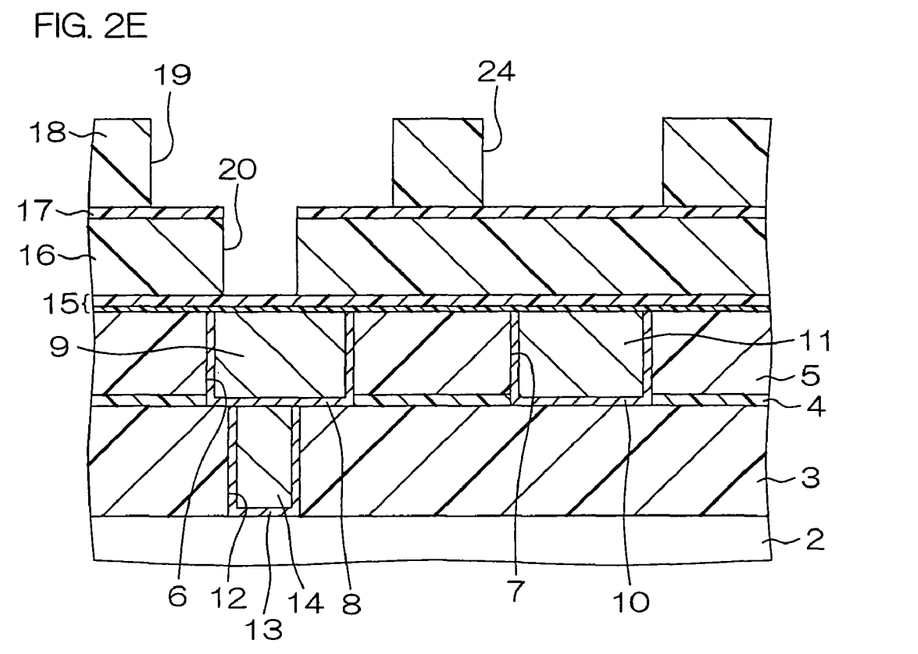
FIG. 2E is a schematic sectional view of a step subsequent to that of FIG. 2D.

Thereafter, as shown in FIG. 2E, the bulk 27 and the resist film 28 are removed by ashing.

Figure 2F:
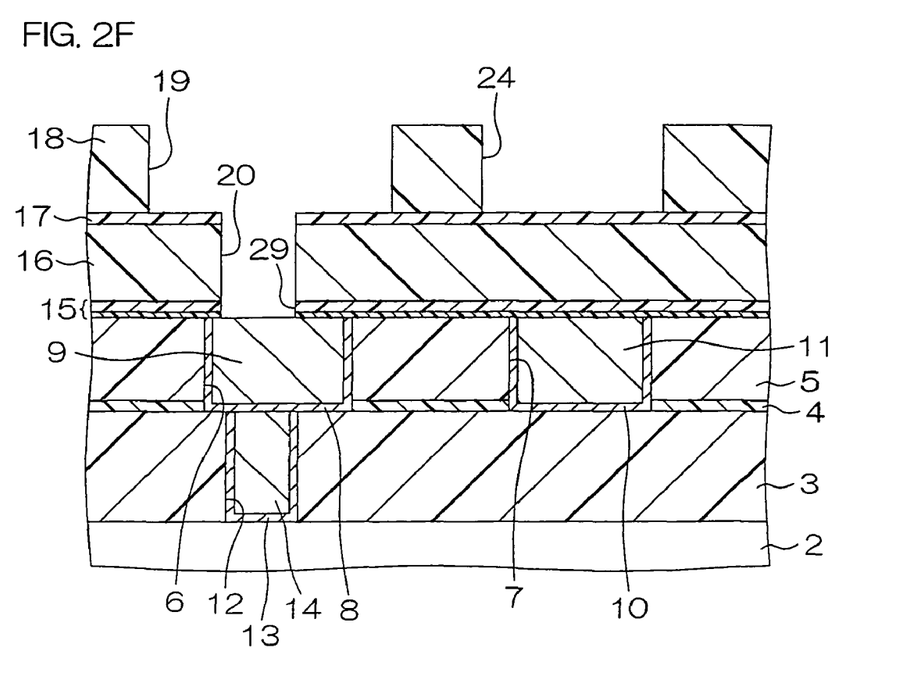
FIG. 2F is a schematic sectional view of a step subsequent to that of FIG. 2E.

Next, as shown in FIG. 2F, a portion of the etching stopper film 15 facing the via hole 20 is removed by etching. An opening 29 in communication with the via hole 20 and partially exposing the upper surface of the first lower layer wiring 9 is thereby formed in the etching stopper film 15.

Thereafter, a barrier film made of Ta (not shown) is coated on the upper wiring layer 18 including the inner surfaces of the first upper groove 19, the via hole 20 and the second upper groove 24. Then, a plating layer made of Cu (not shown) is formed on the barrier film by a plating method. The plating layer is formed to a thickness of completely filling the first upper groove 19 and the second upper groove 24. Thereafter, the plating layer and the barrier film are polished by a CMP (Chemical Mechanical Polishing) method. The polishing process is continued until portions of the plating layer and the barrier film formed outside the first upper groove 19 and the second upper groove 24 are removed and the top surface of the upper wiring layer 18 becomes exposed. The first upper layer wiring 22 and the via 23 are thereby integrally formed in the first upper groove 19 and the via hole 20, respectively. Further, the second upper layer wiring 26 is formed in the second upper groove 24. Thus, the semiconductor device 1 shown in FIG. 1 is obtained.

As described above, the etching stopper film 15 is laminated on the first lower layer wiring 9 made of Cu. The second interlayer insulating film 16 is laminated on the etching stopper film 15. The intermediate film 17 made of $SiO_2$, having an etching selectivity with respect to the SiOC that is the material of the etching stopper film 15, is laminated on the second interlayer insulating film 16. The upper wiring layer 18 is laminated on the intermediate film 17. The first upper groove 19 is formed by digging in from the top surface of the upper wiring layer 18. The first upper layer wiring 22 made of Cu is embedded in the first upper groove 19. The via hole 20 is formed penetratingly in the second interlayer insulating film 16 and the intermediate film 17. The via 23 made of the same material as the first upper layer wiring 22 is disposed in the via hole 20. The first lower layer wiring 9 and the first upper layer wiring 22 are electrically connected via the via.

The intermediate film 17 is made of the material having an etching selectivity with respect to the materials of the etching stopper film 15. Thus, there is no possibility for the intermediate film 17 to be etched during the etching for forming the opening 29 in the etching stopper film 15. The intermediate film 17 can thus be left on the second interlayer insulating film 16 reliably. Consequently, undesired etching of the second interlayer insulating film 16 can be prevented.

Various modifications can be applied to the present embodiment. For example, although SiOC and SiCN are used as the materials of the etching stopper film 15 and $SiO_2$ is used as the material of the intermediate film 17, it suffices that these materials be of a combination of materials having an etching selectivity. For example, $SiO_2$ may be used as the material of the etching stopper film 15 and SiOC may be used as the material of the intermediate film 17.

The first lower layer wiring 9, the second lower layer wiring 11, the contact plug 14, the first upper layer wiring 22, the via 23 and the second upper layer wiring 26 do not need to be formed solely of Cu. A metal material containing a component other than Cu as an accessory component may be employed as the material of the first lower layer wiring 9, the second lower layer wiring 11, the contact plug 14, the first upper layer wiring 22, the via 23 and the second upper layer wiring 26.

Further, although Ta is used as the material of the barrier films 8, 10, 13, 21, and 25, it suffices that the material of the barrier films 8, 10, 13, 21, and 25 be a metal material having a barrier property with respect to the diffusion of Cu, and TaN (tantalum nitride) and $Mn_xSi_yO_z$ (where x, y, and z are numbers greater than zero) can be cited as examples.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-289779, filed with the Japan Patent Office on Nov. 7, 2007, the disclosure of which is incorporated herein by reference.

What is claimed is:

1. A semiconductor device, comprising:
   a lower layer wiring made of a conductive material;
   an etching stopper film laminated on the lower layer wiring and having a laminated structure including an SiCO layer and an SiCN layer;
   an interlayer insulating film laminated on the etching stopper film;
   an intermediate film laminated on the interlayer insulating film and made of a material having an etching selectivity with respect to a material of the etching stopper film, the intermediate film having a thickness such that etching time of the intermediate film is longer than that of the etching stopper film when the intermediate film and the etching stopper film are simultaneously subjected to etching;
   an upper wiring layer laminated on the intermediate film and having an upper groove formed in a top surface thereof;
   an upper layer wiring embedded in the upper groove and made of a metal material having Cu as a main component; and
   a via electrically connecting the lower layer wiring and the upper layer wiring, made of the same material as the material of the upper layer wiring, and disposed in a via hole penetrating through the interlayer insulating film and the intermediate film so that the via is integral with the upper wiring layer.

2. The semiconductor device according to claim 1, wherein the material of the intermediate film is $SiO_2$.

3. The semiconductor device according to claim 1, further comprising an upper barrier film having a barrier property with respect to Cu and interposed between the upper layer wiring and an inner surface of the upper groove.

4. The semiconductor device according to claim 1, further comprising a lower wiring layer disposed below the etching stopper film, wherein the lower layer wiring is embedded in a lower groove formed in a top surface of the lower wiring layer.

5. The semiconductor device according to claim 4, wherein the conductive material is a metal material having Cu as a main component.

6. The semiconductor device according to claim 5, further comprising a lower barrier film having a barrier property with respect to Cu and interposed between the lower layer wiring and an inner surface of the lower groove.

7. A semiconductor device, comprising:
   a first lower layer wiring made of a conductive material;
   an etching stopper film that is laminated on the lower layer wiring, that has a laminated structure including an SiCO layer and an SiCN layer, and that has an opening defined there through down to the first lower layer wiring;
   a second interlayer insulating film that is laminated on the etching stopper film, and that has a via hole defined there through that joins said opening in the etching stopper film;
   an intermediate film that is laminated on the second interlayer insulating film, that has a via hole defined there through that joins said via hole of the interlayer insulating film;
   an upper wiring layer laminated on the intermediate film and having a first upper groove formed in a top surface thereof;
   an first upper layer wiring that is embedded in the first upper groove, that is made of a metal material having Cu as a main component, and that includes a via integrally formed therewith disposed in the via hole that penetrates through the intermediate film and the second interlayer insulating film, and in opening in the etching stopper film, and that extends to and contacts the first lower layer wiring so that the first lower layer wiring and the first upper layer wiring are electrically connected,
   wherein the intermediate film is made of a material having an etching selectivity with respect to the SiCO layer of the etching stopper film and has a thickness so that, in combination, etching of the intermediate film is prevented during etching of the etching stopper film to define said opening there through down to the first lower layer wiring, and so that undesired etching of the second interlayer insulating film is prevented because the intermediate film remains in place.

8. The semiconductor device according to claim 7, wherein the material of the intermediate film is $SiO_2$.

9. The semiconductor device according to claim 8, wherein the second interlayer insulating film is comprised of SiOC.

10. The semiconductor device according to claim 7, further comprising an upper barrier film having a barrier property with respect to Cu and interposed between the first upper layer wiring and an inner surface of the first upper groove.

11. The semiconductor device according to claim 7, further comprising a lower wiring layer disposed below the etching stopper film, wherein the lower layer wiring is embedded in a lower groove formed in a top surface of the lower wiring layer.

12. The semiconductor device according to claim 11, wherein the conductive material of the first lower layer wiring is a metal material having Cu as a main component.

13. The semiconductor device according to claim 12, further comprising a lower barrier film having a barrier property with respect to Cu and interposed between the first lower layer wiring and an inner surface of the lower groove.

14. A semiconductor device, comprising:
- a first lower layer wiring that is made of a material having Cu as a main component;
- an etching stopper film that is laminated on the lower layer wiring, that has a laminated structure including an SiCO layer and an SiCN layer, and that has an opening defined there through down to the first lower layer wiring;
- a second interlayer insulating film comprised of SiOC that is laminated on the etching stopper film, and that has a via hole defined there through that joins said opening in the etching stopper film;
- an intermediate film comprised of $SiO_2$ that is laminated on the second interlayer insulating film, that has a via hole defined there through that joins said via hole of the interlayer insulating film;
- an upper wiring layer comprised of SiCO laminated on the intermediate film and having a first upper groove formed in a top surface thereof;
- an first upper layer wiring that is embedded in the first upper groove, that is made of a metal material having Cu as a main component, and that includes a via integrally formed therewith disposed in the via hole that penetrates through the intermediate film and the interlayer insulating film, and in opening in the etching stopper film, and that extends to and contacts the first lower layer wiring so that the first lower layer wiring and the first upper layer wiring are electrically connected,
- wherein the $SiO_2$ of which the intermediate film is comprised is a material having an etching selectivity with respect to the SiCO layer of the etching stopper film and has a thickness so that, in combination, etching of the intermediate film is prevented during etching of the etching stopper film to define said opening there through down to the first lower layer wiring, and so that undesired etching of the second interlayer insulating film is prevented because the intermediate film remains in place.

15. The semiconductor device according to claim 14, further comprising an upper barrier film having a barrier property with respect to Cu and interposed between the first upper layer wiring and an inner surface of the first upper groove.

* * * * *